(12) United States Patent
Kim

(10) Patent No.: US 7,119,427 B2
(45) Date of Patent: Oct. 10, 2006

(54) STACKED BGA PACKAGES

(75) Inventor: Jung-Jin Kim, Hwaseong-si (KR)

(73) Assignee: Samsung Electronics Ltd., Co., Gyeonggi-do (KR)

(*) Notice: Subject to any disclaimer, the term of this patent is extended or adjusted under 35 U.S.C. 154(b) by 0 days.

(21) Appl. No.: 10/902,826

(22) Filed: Aug. 2, 2004

(65) Prior Publication Data

US 2005/0104182 A1    May 19, 2005

(30) Foreign Application Priority Data

Nov. 13, 2003    (KR) .................. 10-2003-0080079

(51) Int. Cl.
  H01L 23/40    (2006.01)
  H01L 23/52    (2006.01)
  H01L 29/40    (2006.01)
  H01L 23/02    (2006.01)
(52) U.S. Cl. .................. 257/686; 257/777; 257/784; 257/780; 257/723
(58) Field of Classification Search .............. 257/686, 257/777, 784, 780
See application file for complete search history.

(56) References Cited

U.S. PATENT DOCUMENTS 6,555,917 B1 * 4/2003 Heo .......................... 257/777
6,770,822 B1 * 8/2004 Pasternak et al. ............ 174/260
2002/0149097 A1 * 10/2002 Lee et al. .................... 257/686
2004/0113253 A1 * 6/2004 Karnezos .................... 257/686

FOREIGN PATENT DOCUMENTS

| KR | 2000-0056804 | 9/2000 |
|---|---|---|
| KR | 2001-0068513 | 7/2001 |
| KR | 2002-0032065 | 5/2002 |
| KR | 2002-0060311 | 7/2002 |
| KR | 2003-0012192 | 2/2003 |

OTHER PUBLICATIONS

Office Action mailed Oct. 21, 2005 for counterpart Korean Patent Application No. 10-2003-0080079 and English translation.

* cited by examiner

*Primary Examiner*—Nitin Parekh
(74) *Attorney, Agent, or Firm*—Harness, Dickey & Pierce

(57) ABSTRACT

Provided are double stacked and multiple stacked BGA packages in which two or more BGA packages are stacked to increase the packaging density. Each of the individual BGA packages included in the stacked BGA packages includes at least one semiconductor chip and a substrate on which the chip is mounted with the substrate(s) being sized to be approximately the same size or, in some instances, slightly larger than the semiconductor chip(s) mounted thereon. A plurality of external contact terminals are provided on each of the substrates, with the corresponding external contact terminals of the multiple BGA packages being electrically connected using a flexible substrate.

13 Claims, 3 Drawing Sheets

STACKED BGA PACKAGES

CROSS-REFERENCE TO RELATED APPLICATION

This application claims the priority of Korean Patent Application No. 2003-80079, which was filed on Nov. 13, 2003, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a stacked BGA (ball grid array) package capable of increasing packaging density per area.

2. Description of the Related Art

As semiconductor technologies have become advanced, more highly integrated and higher performing semiconductor devices have been developed. One of the methods developed for increasing the capability of a semiconductor device is a method of stacking multiple chips or packages in a single device. These semiconductor stacking methods allow semiconductor device package density to be increased even in instances in which the sizes of the individual semiconductor devices increase or remain constant.

The stacked semiconductor device can be implemented as a chip stacked device in which bare chips, that is, non-packaged chips, are stacked, or as a package stacked device in which packaged devices are stacked after an assembling process. Because typically only the basic electrical characteristics and functionality of the chips are tested before packaging, chip stacked devices are more likely to incorporate one or more chips having incomplete functionality and/or inadequate performance. This result is problematic because the packaging process itself may be relatively expensive compared to the chip cost and good chips will likely be discarded along with the underperforming chip(s), thereby reducing the yield and increasing the cost when chip stacked devices are discarded. Package stacked devices, sometimes referred to as three-dimensional stacked semiconductor devices, typically include two or more premanufactured and tested packages arranged in a substantially vertical stack.

On the other hand, as electronic devices have become smaller and lighter, efforts have continued to reduce the size of the semiconductor chip packages incorporated in such devices. In addition, as semiconductor devices have become more highly integrated and faster, various configurations and methods have been investigated in an effort to produce economical and reliable packages. As a result of these efforts, ball grid array (BGA) packages, in which external electrical contact portions are arranged in a grid structure, were developed and have enjoyed widespread acceptance. BGA packages are advantageous in that they provide a method for coping with the increasing number of input/output pins required for the operation of highly integrated semiconductor chips while reducing the inductive component of the electrical contact portions and allowing package sizing to approach chip scale.

FIG. 1 is a cross-sectional view illustrating a conventional stacked BGA package in which an upper BGA package 120 is stacked on a lower BGA package 110. Provided on an upper surface of the lower BGA package 110 are a plurality of lands 112, arranged outside the periphery of the central chip regions, for receiving and forming electrical and mechanical connections to the connecting solder balls 122 provided on the lower surface of the upper BGA package 120. The BGA packages included in this conventional stacked BGA package structure are larger than the incorporated semiconductor chips 115, 125, making it difficult to incorporate or adapt such BGA packages into package stacked devices that more closely approximate a chip scale package (CSP) sizing. In addition, the ability to reduce the height of the conventional stacked BGA package device illustrated in FIG. 1 is hampered by the size of the solder balls 122 required to maintain a gap 127 or separation distance between the lower and upper BGA packages 110 and 120.

SUMMARY OF THE INVENTION

The present invention provides embodiments of stacked BGA package devices including two or more stacked BGA packages. The stacked BGA package devices of the present invention encompass an exemplary double stacked BGA package including an upper BGA package and a lower BGA package. The lower BGA package includes a first substrate and first external contact terminals formed on the first substrate and the upper BGA package includes a second substrate and second external contact terminals formed on the second substrate.

The upper and lower BGA packages are arranged so that the back surfaces of the upper and lower BGA packages are attached with a flexible substrate being arranged for connecting the first and second external contact terminals. The lower BGA package further includes solder balls arranged below the first substrate and connected to the first external contact terminals via through holes provided in the first substrate and a first chip that is internally connected to the solder balls through a first plurality of wires. The upper BGA package further includes a second chip that is internally connected to the second substrate and the second external contact terminals through a second plurality of wires.

The exemplary embodiments of the double stacked BGA package device may include a flexible substrate comprising a wiring pattern layer arranged and configured for connecting the first and second contact terminals and a flexible insulating layer for insulating the wiring pattern layer. The upper BGA package may also include solder balls (not shown) arranged below the second substrate and connected to the first external contact terminals via through holes provided in the second substrate.

In another exemplary embodiment according to the present invention, a multiple stacked BGA package is provided wherein two or more double stacked BGA packages according to the present invention are, in turn, stacked. An exemplary multiple stacked BGA package according to the invention includes a first double stacked BGA package disposed below a second double stacked BGA package with the solder balls arranged on the lower BGA package of the second double stacked BGA package serving to connect the second double stacked BGA package to connection regions provided on the substrate of the upper BGA package of the first double stacked BGA package. These connection regions may be contact terminals disposed on the substrate of the upper BGA package of the first double stacked BGA package and connected to the chip incorporated in in the upper BGA package of the first double stacked BGA package. Both the double and multiple stacked BGA package manufactured according to the invention have a peripheral size approaching that of the incorporated semiconductor chips, thereby allowing the packaging density to be increased.

BRIEF DESCRIPTION OF THE DRAWINGS

The above and other features and advantages of the present invention will become more apparent by reviewing the following detailed description of certain exemplary embodiments thereof with reference to the attached drawings in which.

Figure 1:
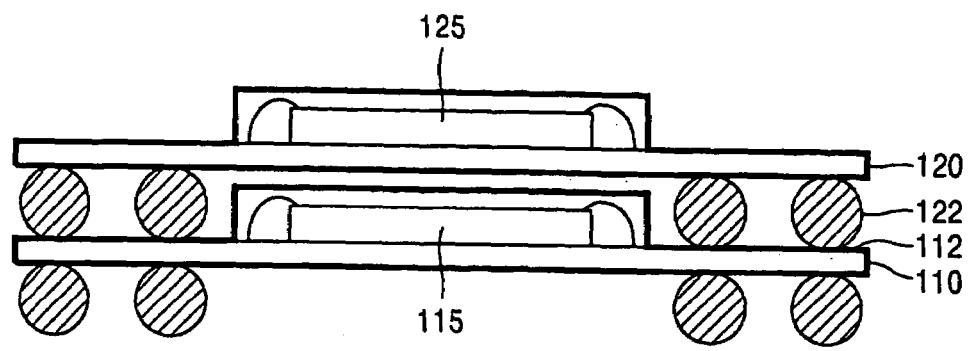
FIG. 1 is a cross-sectional view illustrating a conventional stacked BGA package.

These drawings have been provided to assist in the understanding of the exemplary embodiments of the invention as described in more detail below and should not be construed as unduly limiting the invention. In particular, the relative spacing, sizing and dimensions of the various elements illustrated in the drawings are not drawn to scale and may have been exaggerated, reduced or otherwise modified for the purpose of improved clarity.

DETAILED DESCRIPTION OF EXEMPLARY EMBODIMENTS

Exemplary embodiments of the present invention are described in detail below with reference to the accompanying drawings to explain the present invention to those of ordinary skill in the art. In the drawings, the same reference numerals are used to indicate the same or corresponding elements.

Figure 2A:
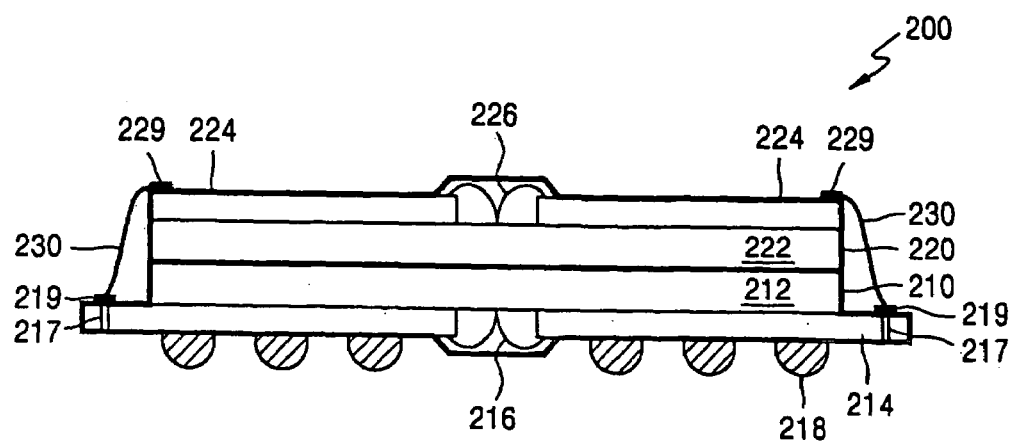
FIG. 2A is a cross-sectional view illustrating a double stacked BGA package according to a first embodiment of the present invention.

FIG. 2A is a cross-sectional view illustrating a double stacked BGA package according to a first embodiment of the present invention. The double stacked BGA package 200 has a stacked structure in which lower and upper stacked BGA packages 210 and 220 are attached to each other. More specifically, an adhesive composition is provided between the back surfaces (also referred to as the backside surfaces) of the semiconductor chips 212, 222 for attaching the two chips together, thereby also attaching the lower and upper BGA packages 210, 220 together in a package stacked arrangement. In this arrangement the active surfaces, i.e., those surfaces on which the semiconductor device circuitry is provided, of both semiconductor chips are oriented toward the exterior surfaces of the stacked package device. The adhesive composition may form an adhesive layer.

The semiconductor chip 212 incorporated in the lower BGA package 210 may be electrically connected to the substrate 214 through bonding wires 216. Similarly, the semiconductor chip 222 incorporated in the upper BGA package 220 may be connected to the substrate 224 through bonding wires 226. As illustrated in FIG. 2A, the two semiconductor chips 212, 222 include a central bonding pad array structure from which the bonding wires 216, 226 extend to provide electrical connection to corresponding bonding regions provided on the associated substrates 214, 224. Solder balls 218 or other conductive structures (not shown) may be provided on the substrate 214 on primary external surface of the lower BGA package 210 opposite the semiconductor chip 212. Peripheral lower contact terminals 219 may be provided on a minor external surface of the substrate 214 opposite a peripheral portion of the primary external surface of the substrate 214. The lower contact terminals 219 may, in turn, be electrically connected to the wires 216 via through holes 217 formed in the substrate 214, wiring patterns (not shown) provided on the substrate and/or solder balls 218. Upper contact terminals 229 may be provided on the external surface of substrate 224 that forms the upper surface of the stacked BGA package device 200 with the upper contact terminals being electrically connected to corresponding ones of the bonding wires 226.

Figure 2B:
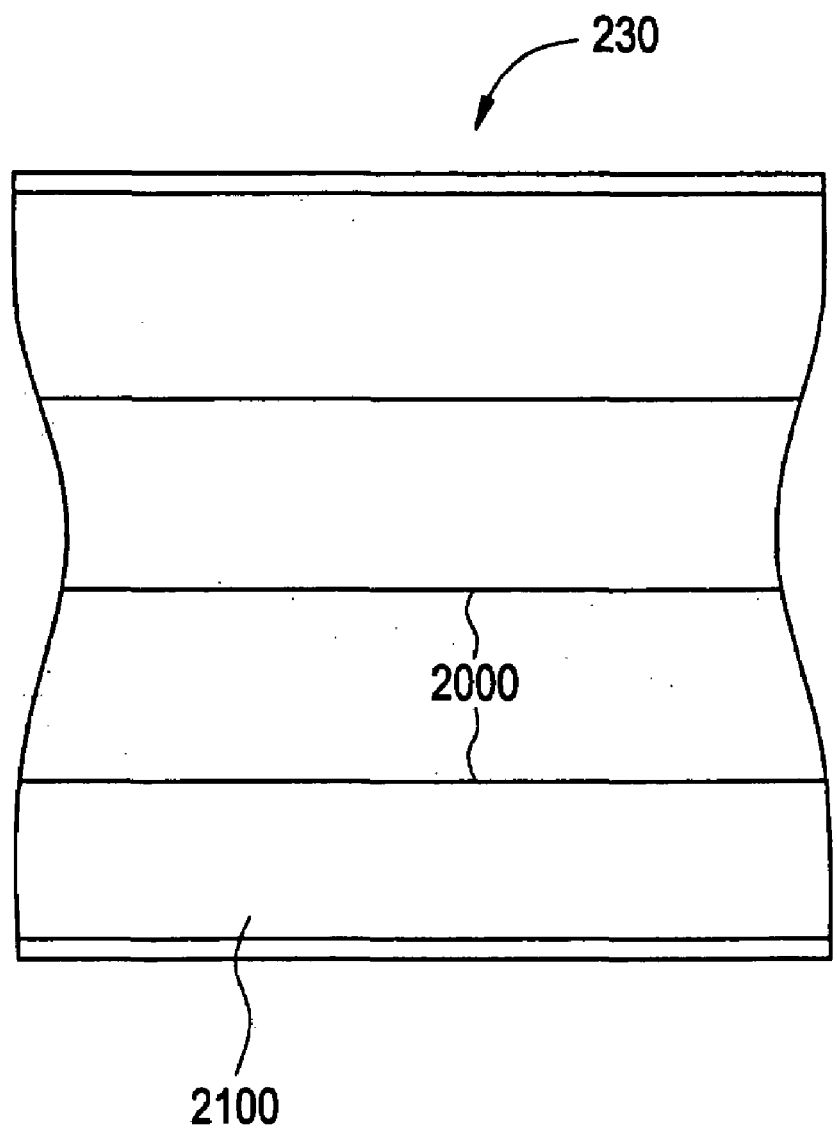
FIG. 2B is a view of a flexible substrate according to an example embodiment of the present invention.

As illustrated in FIG. 2A, the lower and upper BGA packages 210 and 220 may be electrically connected to each other using a flexible substrate 230. The flexible substrate 230 includes both a flexible insulating layer 2100 and a wiring pattern 2000 layer as shown in FIG. 2B. The wiring pattern 2000 layer functions as the interconnection leads for connecting the respective contact terminals 219, 229 of the lower and upper BGA packages 210, 220.

In a double stacked BGA package 200 according to a first exemplary embodiment of the invention, the substrate 214 of the lower BGA package 210 may be wider than the incorporated semiconductor chip 212 and the substrate 224 of the upper BGA package 220, resulting in a projecting peripheral region. Because solder balls need not be provided on the upper surface of the upper BGA package 220, the substrate 224 of the upper BGA package 220 may have substantially the same dimensions as the associated semiconductor chip 222. Because solder balls are provided on the lower surface of the stacked BGA package device 200, i.e., the upper or primary external surface of the lower BGA package 210, the substrate 214 may have dimensions exceeding those of the associated semiconductor chip 212.

Although, as illustrated in FIG. 2A, solder balls are not provided on the external surface of substrate 224 of the upper BGA package 220 in the present invention, it will be apparent to those of ordinary skill in the art that an alternative embodiment would include solder balls can be provided on the substrate 224 of the upper BGA package 220 in addition to or instead of the solder balls 218 provided on substrate 214.

Figure 3:
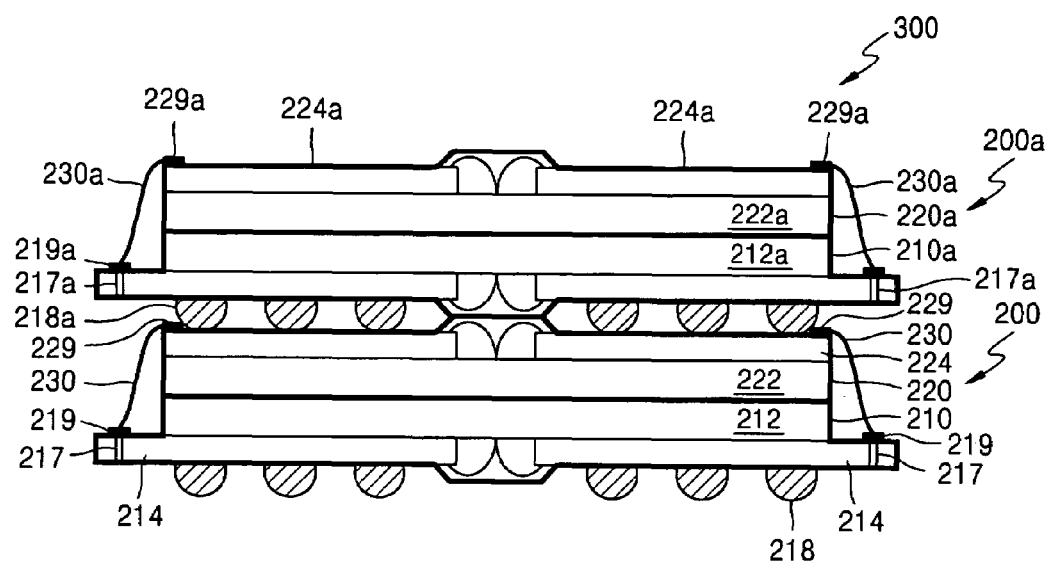
FIG. 3 is a cross-sectional view illustrating a multiple stacked BGA package according to a second embodiment of the present invention.

FIG. 3 is a view illustrating a multiple stacked BGA package 300 according to a second embodiment of the present invention. The multiple stacked BGA package 300 is constructed by stacking two double stacked BGA packages 200, 200a, both of which, in this instance, each generally correspond to the stacked BGA package 200 previously described and as illustrated in FIG. 2A. The lower double stacked BGA package 200 is illustrated with the same reference numerals as the double stacked BGA package 200 of FIG. 2A while the reference numerals associated with the upper double stacked BGA package 200a include a corresponding "a" suffix.

In the multiple stacked BGA package 300, the chips 212 and 222 of the lower double stacked BGA package 200, which are connected through the solder balls 218, the through holes 217, the contact terminals 219 of the lower BGA package 210, the flexible substrate 230, and the contact terminals 229 of the upper BGA package 220, are electrically connected to the chips 212a and 222a of the upper double stacked BGA package 200a. The chips 212a and 222a of the upper double stacked BGA package 200a are, in turn, connected through the solder balls 218a, the through holes 217a, the contact terminals 219a of the lower BGA package 210a, the flexible substrate 230a, and the contact terminals 229a of the upper BGA package 220a.

Figure 4:
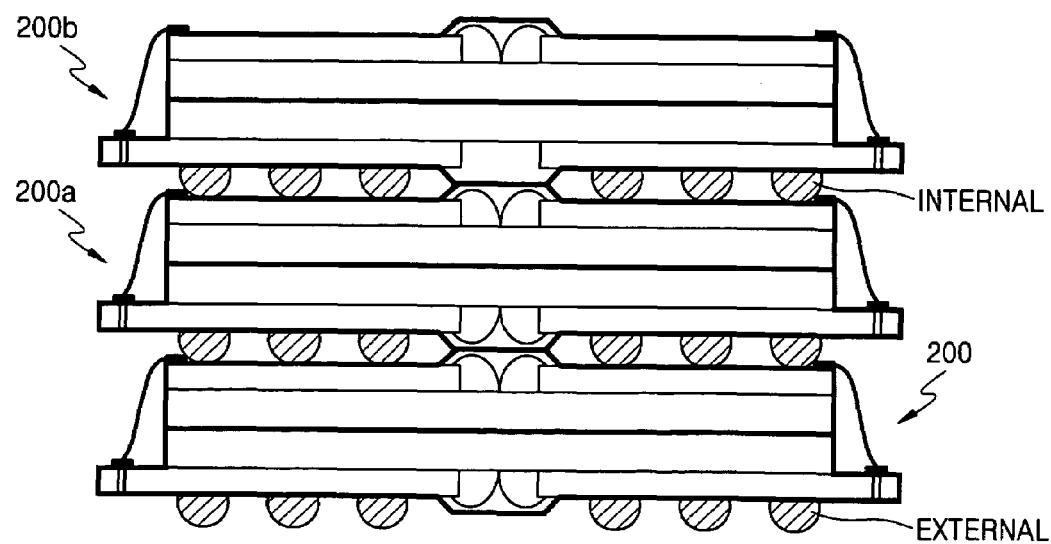
FIG. 4 is a cross-sectional view illustrating a multiple stacked BGA package according to a third embodiment of the present invention.

In the multiple stacked BGA package illustrated in FIG. 4, a series of three stacked BGA packages 200, 200a and 200b are stacked and connected in a manner similar to that described above with respect to FIG. 3. As illustrated in FIG. 4, each of the upper stacked BGA packages 200a, 200b, are electrically and mechanically connected to the next underlying stacked BGA package, 200, 200a, through an array of internal solder balls or other conductive connector structures. The lowermost of the stacked BGA packages, in this instance package 200, will have provided on its lower surface an array of external solder balls or other conductive connector structures that can be used to mount the multiple stacked BGA package to a circuit board or other substrate (not shown).

Accordingly, both the double stacked BGA package 200 illustrated in FIG. 2A and the exemplary multiple stacked BGA packages illustrated in FIGS. 3 and 4 will occupy substantially the same surface area as any one of the enclosed chips 212, 222, 212a and 222a. Thus, by providing a package in which two, four, six or more chips can be mounted in substantially the same area, the exemplary packages according to the present invention allow the packaging density per area to be increased.

While the present invention has been particularly shown and described with reference to certain exemplary embodiments thereof, it will be understood by those of ordinary skill in the art that various changes in form and details may be made therein without departing from the spirit and scope of the present invention as defined by the following claims.

What is claimed is:

1. A stacked BGA package comprising:
   a lower BGA package including a first semiconductor chip having a first active surface and a first backside surface, a first substrate and first external contact terminals arranged on the first substrate;
   an upper BGA package including a second semiconductor chip having a second active surface, second backside surface, a second substrate and second external terminals arranged on the second substrate, wherein the first and second backside surfaces are attached to one another; and
   a flexible substrate including a plurality of wires providing electrical connection between the first external terminals and corresponding ones of the second external terminals.

2. A stacked BGA package according to claim 1, wherein:
   the first substrate has a major external surface and a minor peripheral external surface opposite a peripheral portion of the major external surface, the first external terminals being arranged on the minor peripheral external surface; and
   the second substrate has a major external surface, the second external terminals being arranged on the major external surface.

3. A stacked BGA package according to claim 1, wherein: an adhesive layer is formed between the first and second backside surfaces.

4. A stacked BGA package according to claim 3, wherein:
   the adhesive layer provides a connection between the first semiconductor chip and the second semiconductor chip.

5. A stacked BGA package according to claim 1, further comprising:
   a plurality of first external contacts arranged on the major external surface of the first substrate, wherein the first external contacts are electrically connected to corresponding ones of the first external terminals.

6. A stacked BGA package according to claim 5, further comprising:
   a plurality of conductive vias formed through the peripheral portion of the first substrate for connecting the first external contacts and the corresponding ones of the first external terminals.

7. A stacked BGA package according to claim 6, wherein:
   the first external contacts are selected from a group consisting of solder balls, solder bumps and solder patterns.

8. A stacked BGA package according to claim 5, further comprising:
   a first plurality of bonding wires, the bonding wires providing electrical connection between bonding pads arranged on the first active surface and bonding regions arranged on the first substrate; and
   a second plurality of bonding wires, the bonding wires providing electrical connection between bonding pads arranged on the second active surface and bonding regions arranged on the second substrate.

9. A stacked BGA package according to claim 8, further comprising:
   a first protective encapsulant formed over the first plurality of bonding wires and a second protective encapsulant formed over the second plurality of bonding wires.

10. A multiple-stacked BGA package comprising:
    first and second double-stacked BGA packages according to claim 5, wherein the second double-stacked BGA package is stacked on the first double-stacked BGA package; and further wherein;
    ball landing pads are provided on the major external substrate of the second substrate of the first double-stacked BGA package; and
    the first external contacts provided on the major external surface of the first substrate of the second double-stacked BGA package are arranged to make electrical contact to corresponding ones of the ball landing pads.

11. A stacked BGA package according to claim 1, wherein:
    the flexible substrate includes:
    a wiring pattern layer including the plurality of wires, the wiring pattern layer providing electrical connection between the first and second external terminals; and
    a flexible insulating layer for insulating the wiring pattern layer.

12. A multiple-stacked BGA package comprising:
    first and second double-stacked BGA packages according to claim 1, wherein the second double-stacked BGA package is stacked on the first double-stacked BGA package; and further wherein;
    ball landing pads are provided on the major external substrate of the first substrate of the second double-stacked BGA package; and
    first external contacts are provided on the major external surface of the second substrate of the first double-stacked BGA package and arranged to make electrical contact to corresponding ones of the ball landing pads.

13. The stacked BGA package according to claim 1, wherein the flexible substrate is external to the lower BGA package and upper BGA package.

* * * * *